United States Patent
Ko et al.

(10) Patent No.: US 9,414,174 B2
(45) Date of Patent: Aug. 9, 2016

(54) METHOD AND APPARATUS FOR CONTROLLING AUDIO OUTPUT

(71) Applicant: Samsung Electronics Co., Ltd., Gyeonggi-do (KR)

(72) Inventors: Hanho Ko, Seoul (KR); Jeheon Park, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 215 days.

(21) Appl. No.: 14/013,319

(22) Filed: Aug. 29, 2013

(65) Prior Publication Data
US 2014/0064503 A1    Mar. 6, 2014

(30) Foreign Application Priority Data
Aug. 30, 2012    (KR) .................. 10-2012-0095755

(51) Int. Cl.
| H04R 19/01 | (2006.01) |
| --- | --- |
| H04R 29/00 | (2006.01) |
| H03G 1/02 | (2006.01) |
| H04R 5/04 | (2006.01) |
| H04R 3/00 | (2006.01) |
| H04R 5/033 | (2006.01) |

(52) U.S. Cl.
CPC .............. *H04R 29/001* (2013.01); *H03G 1/02* (2013.01); *H04R 3/00* (2013.01); *H04R 5/033* (2013.01); *H04R 5/04* (2013.01)

(58) Field of Classification Search
CPC ............ H04R 5/033; H04R 5/04; H04R 3/00; H04R 1/101; H04R 2430/01; H03G 1/02
USPC .............. 381/384, 111, 58, 77, 124, 74, 71.6, 381/120, 92; 330/297, 127, 207
See application file for complete search history.

(56) References Cited

U.S. PATENT DOCUMENTS

| 7,349,546 | B2 * | 3/2008 | Ganton .......................... 381/58 |
| --- | --- | --- | --- |
| 8,014,539 | B2 | 9/2011 | Song et al. |
| 8,077,875 | B2 * | 12/2011 | Hung et al. ..................... 381/74 |
| 8,126,164 | B2 * | 2/2012 | Bjorn-Josefsen et al. .... 381/109 |
| 8,412,268 | B2 * | 4/2013 | Inha et al. ..................... 455/557 |
| 8,600,080 | B2 * | 12/2013 | Sander et al. ................. 381/113 |
| 8,675,130 | B2 * | 3/2014 | Fincham ....................... 348/552 |
| 9,084,035 | B2 * | 7/2015 | Gustavsson .............. H04R 5/04 |
| 2001/0053228 | A1 * | 12/2001 | Jones .......................... 381/71.6 |

(Continued)

FOREIGN PATENT DOCUMENTS

KR    1020070048067    5/2007

*Primary Examiner* — Davetta W Goins
*Assistant Examiner* — Kuassi Ganmavo
(74) *Attorney, Agent, or Firm* — The Farrell Law Firm, P.C.

(57) ABSTRACT

A method and portable terminal for automatically controlling an output volume of audio output of a head phone when the head phone is connected to a portable terminal are provided. The method of controlling an audio output in a portable terminal, includes outputting a test audio signal to a head phone for a preset playback time when the head phone is connected to the portable terminal; collecting neighboring noise interval information and impedance interval information of the head phone while the test audio signal is output to the head phone; determining impedance of the head phone based on the neighboring noise interval information and the impedance interval information; determining a gain of an audio signal based on the determined impedance; and amplifying the audio signal in proportion to the determined gain, and outputting the amplified audio signal to the head phone.

10 Claims, 7 Drawing Sheets

(56) References Cited

U.S. PATENT DOCUMENTS

| | | | |
|---|---|---|---|
| 2003/0185400 A1* | 10/2003 | Yoshizawa et al. | 381/58 |
| 2007/0057720 A1* | 3/2007 | Hand et al. | 330/10 |
| 2007/0098190 A1* | 5/2007 | Song | H03F 1/02 381/120 |
| 2011/0086865 A1* | 4/2011 | Borgne-Sanchez et al. | 514/260.1 |
| 2013/0142350 A1* | 6/2013 | Larsen et al. | 381/74 |
| 2014/0003616 A1* | 1/2014 | Johnson et al. | 381/74 |
| 2014/0314243 A1* | 10/2014 | Mehrabi | 381/71.6 |

* cited by examiner

METHOD AND APPARATUS FOR CONTROLLING AUDIO OUTPUT

PRIORITY

This application claims priority under 35 U.S.C. §119(a) to a Korean patent application filed on Aug. 30, 2012 in the Korean Intellectual Property Office and assigned Serial No. 10-2012-0095755, the entire contents of which is hereby incorporated by reference.

BACKGROUND OF THE INVENTION

1. Field of the Invention

The present invention generally relates to a method and an apparatus for controlling an audio output, and more particularly, to a method for automatically controlling an output volume of audio suited to the impedance of a head phone when the head phone is connected to a portable terminal.

2. Description of the Related Art

In recent years, with the significant development of information and communication technology and a semiconductor technology, supply and use of all types of mobile terminals have rapidly increased. In particular, mobile terminals have developed to a mobile convergence stage including traditional functions and other unique terminal functions.

For example, in recent years, portable terminals have provided a multi-media function such as a TV viewing function (e.g., mobile broadcasting such as DMB (Digital Multimedia Broadcasting) or DVB (Digital Video Broadcasting)) as well as general communication functions such as voice call or message transmission/reception.

Portable terminals may also be connected to head phones, such as an ear piece or ear phones through an interface unit such as an ear jack, and may output an audio signal to the head phones through the interface unit. The head phones convert the audio signal into an output sound. Herein, the head phones may be interchangeably described as head phones, a head phone, a head phone set, and the like.

A volume of the sound output from the head phones may vary according to manufacturer, model, and product specification of the head phones. Upon purchasing the portable terminal, the user may receive bundle head phones. The term "bundle" refers to a product sold as a package. For example, the portable terminal may be sold together with a charger, a protection film, and software, as well as the head phones.

An amplitude of a sound output from the portable terminal may be set corresponding to impedance of bundle headphones. Accordingly, when the user uses other head phones (that is, head phones having impedance different from that of the bundle head phones), the amplitude of the sound may be larger or smaller than expected. For example, when head phones having impedance of 300Ω are connected to a portable terminal set corresponding to 30Ω, the amplitude of the sound output through the connected head phones may be too small. In an opposite case, the amplitude of the sound output through the connected head phones may be large.

A control technology of audio output for minimizing the above phenomenon has been developed. That is, the control technology according to the related art detects impedance of connected head phones and controls amplification gain of an audio signal based on the detected impedance to provide stable sound to the user when the head phones are connected to the portable terminal.

However, the control technology of the related art does not consider motional impedance generated when a vibration plate of the head phones vibrates due to neighboring noise. That is, impedance of the head phones detected by the portable terminal is changed according to the neighboring noise; accordingly, the volume of the sound may not be stable.

SUMMARY OF THE INVENTION

The present invention has been made in view of at least the above described problems and disadvantages, and to provide at least the advantages described below. Accordingly, an aspect of the present invention provides a method of controlling an audio output capable of providing a stable sound to a user by controlling an amplification gain of an audio signal based on a neighboring noise, and an apparatus thereof.

In accordance with an aspect of the present invention, a method of controlling an audio output in a portable terminal includes outputting a test audio signal to a head phone for a preset playback time when the head phone is connected to the portable terminal; collecting neighboring noise interval information and impedance interval information of the head phone while the test audio signal is output to the head phone; determining impedance of the head phone based on the neighboring noise interval information and the impedance interval information; determining a gain of an audio signal based on the determined impedance; and amplifying the audio signal in proportion to the determined gain, and outputting the amplified audio signal to the head phone.

In accordance with another aspect of the present invention, a portable terminal includes a microphone; an interface unit for connecting to a head phone; an audio processor outputting an audio signal to the head phone through the interface unit; an amplifier interposed between the audio processor and the interface unit for amplifying an audio signal received from the audio processor and outputting the amplified audio signal to the head phone; an impedance detector detecting an impedance of the head phone; and a controller controlling the audio processor and the amplifier, wherein the controller is configured to output a test audio signal to the head phone for a preset playback time when the head phone is connected to the interface unit, to collect neighboring noise interval information from the microphone and collect impedance interval information from the impedance detector while the test audio signal is output to the head phone, to determine impedance of the head phone based on the neighboring noise interval information and the impedance interval information, to determine a gain of an audio signal based on the determined impedance, and to amplify the audio signal in proportion to the determined gain.

BRIEF DESCRIPTION OF THE DRAWINGS

The objects, features and advantages of the present invention will be more apparent from the following detailed description, taken in conjunction with the accompanying drawings, in which.

DETAILED DESCRIPTION OF EMBODIMENTS OF THE PRESENT INVENTION

Figure 1:
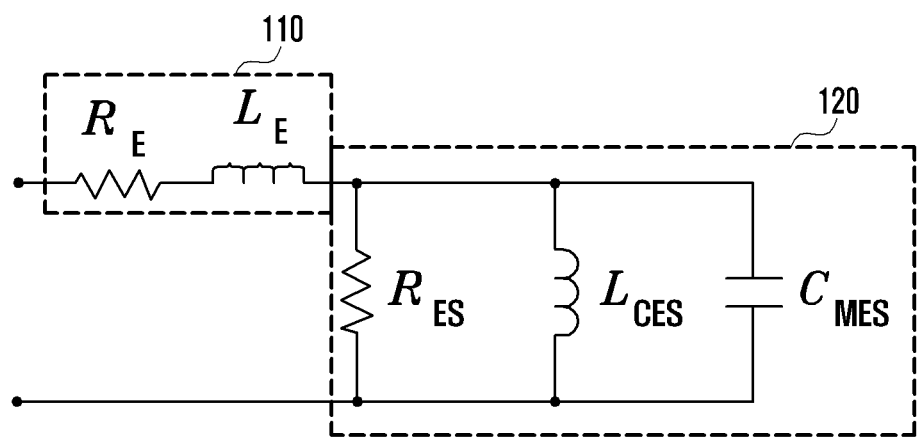
FIG. 1 is a diagram illustrating impedance of a head phone.

Embodiments of the present invention are described in detail with reference to the accompanying drawings. The same reference numbers are used throughout the drawings to refer to the same or like parts. Detailed descriptions of well-known functions and structures incorporated herein may be omitted to avoid obscuring the subject matter of the present invention.

Hereinafter, the method and the apparatus according to the present invention will be described in detail. Detailed descriptions of well-known functions and structures incorporated herein may be omitted to avoid obscuring the subject matter of the present invention. Terms and words used in the specification and the claims shall not be interpreted in accordance with their commonly-used dictionary meanings, but shall be interpreted as to be relevant to the technical scope of the invention based on the fact that the concept of the terms may be properly defined to explain the invention in best ways. Although embodiments will be described with reference to a number of illustrative embodiments thereof, it should be understood that numerous other modifications and embodiments can be devised by those skilled in the art that will fall within the spirit and scope of the principles of this disclosure. Some constituent elements shown in the drawings may be exaggerated, omitted or schematically drawn for the purpose of convenience or clarity As generally known in the art, impedance is a numeric ratio (that is, a measure of the degree of difficulty of flow of an alternating current) of a voltage applied to a circuit (that is, the head phone) to a current flowing through the circuit. A unit of the impedance is an ohm ($\Omega$), and the circuit in which the impedance is measured includes a resistance R, an inductance L, and a capacitance C.

FIG. 1 is a diagram illustrating the impedance of a head phone. Herein, the term "head phone" may be interchangeably described as head phones, a head phone, a head phone set, and the like. Referring to FIG. 1, impedance of the head phone includes intrinsic impedance 110 of the head phone and motional impedance 120 as described above. That is, the impedance of the head phone may vary according to magnitude of the neighboring noise. When there is no neighboring noise, the head phone may include only intrinsic impedance. That is, the present invention is designed in view of detecting an intrinsic impedance or an impedance closest to the intrinsic impedance at a time point when there is the smallest neighboring noise.

The method and the apparatus according to the present invention are applied to a terminal including an interface unit for connecting with the head phone and capable of outputting an audio signal through the interface unit. In particular, the method and the apparatus according to the present invention are applicable to a portable terminal, such as for example, a smart phone, a tablet PC, and a notebook PC.

When the head phone is connected to the portable terminal, the method and the apparatus according to the present invention collects neighboring noise interval information and impedance interval information for a preset time (e.g., two seconds), determines the impedance collected at a time point when there is a minimum neighboring noise (a time point when there is a minimum shaking of a vibration plate of a head phone) as an impedance of head phone with reference to neighboring noise interval information and impedance interval information, determines a gain of an audio signal based on the determined impedance, and amplifies an audio signal proportional to the determined gain and outputs the amplified audio signal to the head phone. The term "neighboring noise interval information" refers to the magnitude of a neighboring noise by time periods collected for a preset time (e.g., two seconds). Here, the magnitude may be a volume or sound pressure. The term "impedance interval information" refers to the impedance of a head phone by time periods collected for a preset time.

Figure 2:
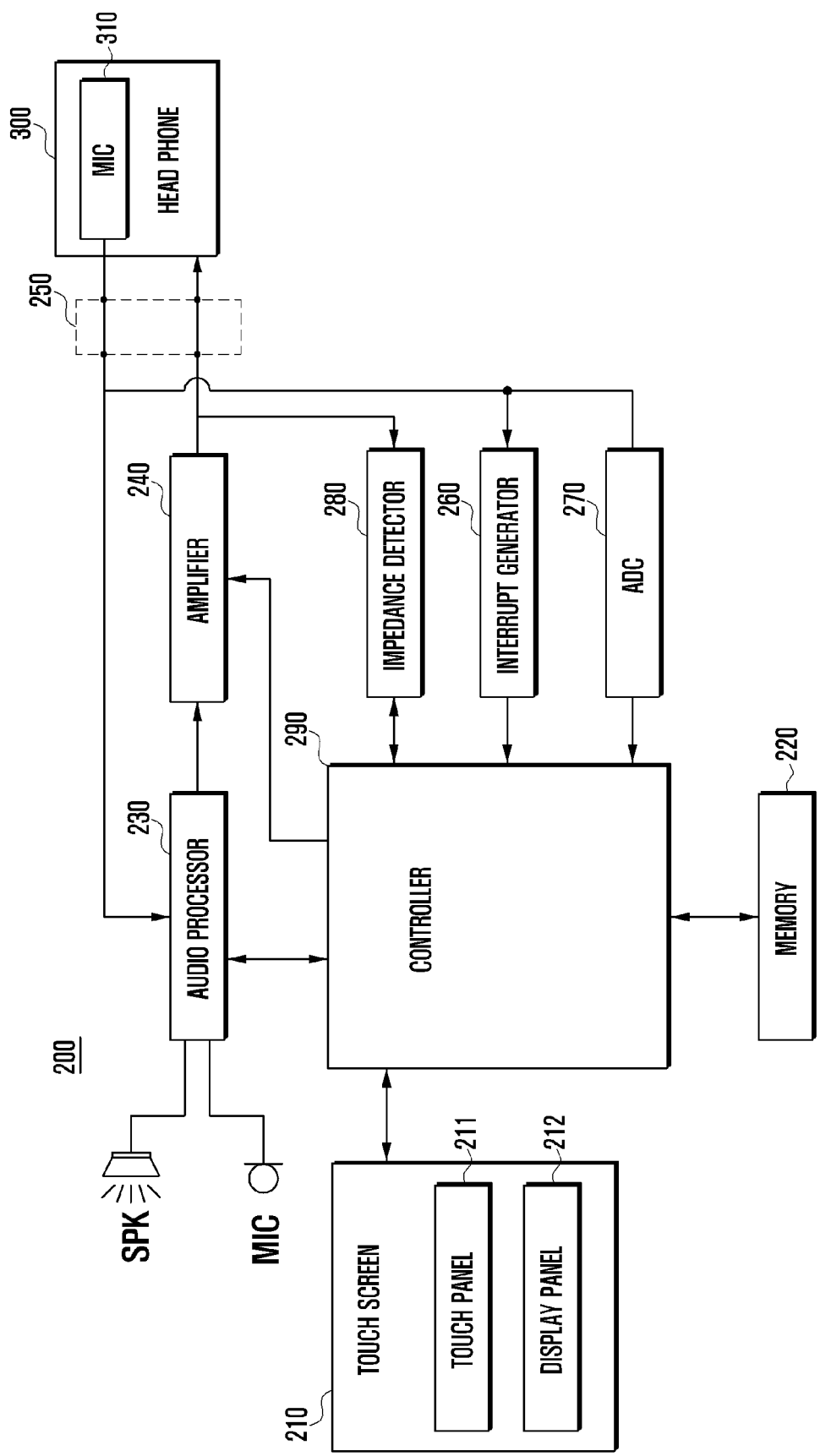
FIG. 2 is a block diagram illustrating a configuration of an apparatus for controlling an audio output according to an embodiment of the present invention.

FIG. 2 is a block diagram illustrating a configuration of an apparatus for controlling an audio output according to an embodiment of the present invention.

Referring to FIG. 2, the apparatus 200 according to the present invention includes a touch screen 210, a memory 220, an audio processor 230, a speaker SPK, a microphone MIC, an amplifier 240, an interface unit 250, an interrupt generator 260, an analog-to-digital (A/D) converter 270, an impedance detector 280, and a controller 290.

The touch screen 210 is an interface for interaction with a user, and includes a touch panel 211 and a display panel 212. The touch panel 111 may be placed on the display panel 212. The touch panel 211 generates an analog signal (e.g., touch event) in response to a user gesture for the touch panel 211, and converts an analog signal into a digital signal and transfers the digital signal to the controller 290. The controller 290 detects a user gesture from a transferred touch event. The user gesture is classified into a touch and a touch gesture. The touch gesture may include a tap, a drag, and a flick. That is, the touch occurs when the user contacts the touch screen, and touch gestures refer to motion of the touch from touch-on the touch screen to touch-off the touch screen.

The touch panel 211 may be a composite touch panel which includes a hand touch panel detecting a hand gesture and a pen touch panel detecting a pen gesture. The hand touch panel may include a capacitive type touch panel, a resistive type touch panel, an infrared beam type touch panel, or an ultrasonic type touch panel. The hand touch panel may generate a touch event by not only the hand gesture of the user but generate the touch event by other objects (such as a conductive material causing variation in capacitance). The pen touch panel may include an electromagnetic induction type touch panel, and generates a touch event by a specially manufactured stylus pen for touch to form a magnetic field. The display panel 212 converts image data input from the controller 290 into an analog signal to display under control of the controller 290. That is, the display panel 212 may provide various screens, for example, a lock screen, a home screen, an application (hereinafter referred to as an "App") execution screen, and a keypad. The display panel 212 may be configured by a Liquid Crystal Display (LCD), an Organic Light Emitted Diode (OLED), an Active Matrix Organic Light Emitted Diode (AMOLED), or the like.

The memory 220 may include a secondary memory unit, for example, a NAND flash memory. The memory 220 stores data (e.g., recording files) generated from the apparatus 200 or data (e.g., music files, video files) received from outside sources through a radio frequency communication unit (not shown) under control of the controller 290. The memory 220 may also store a gain table. The gain table may be provided by types of head phones (e.g., manufacturer, model, or product specification). For example, a gain table for a 3-pole earphone and a gain table for a 4-pole earphone may exist. Further, the memory 220 may store a voltage table for determining a bias voltage of the amplifier 240. The memory 220 stores an operating system (OS) for operating the apparatus 200 and various programs. Particularly, the memory 220 stores a control program of an audio output.

The control program of the audio output according to the present invention includes a function of collecting neighboring noise interval information and impedance interval information for a preset time (e.g., two seconds) when the head phone 300 is connected to the apparatus 200, a function of searching a stabilization time (e.g., 0.1 second) when magnitude of a neighboring noise is lower than a preset threshold value in the collected neighboring noise interval information, a function of determining impedance collected at the stabilization time from the impedance interval information as the impedance of the head phone when there is a stabilization time and determining impedance of the head phone using an impedance calculation algorithm when there is no stabilization time, a function of selecting a gain corresponding to the determined impedance from the gain table and determining the selected gain as a gain of the amplifier 240, and a function of amplifying an audio signal proportional to the determined gain to output to the head phone.

For example, the impedance calculation algorithm may include various algorithms such as an algorithm which averages impedances detected in a convergence frequency interval (frequency interval where impedance is converged to a predetermined value) to obtain impedance of the head phone, and an algorithm to determine impedance detected in a low frequency (e.g., 10 Hz) as impedance of a corresponding headphone. The control program of the audio output according to the present invention may further include a function to select a bias voltage corresponding to the determined gain from the bias voltage table and to determine the selected bias voltage as a bias voltage of the amplifier 240.

The memory 220 may include an embedded application, and a 3rd party application. The term "embedded application" refers to an application which is basically mounted in the apparatus 200. For example, the embedded application may be a browser, an e-mail, or an instant messenger. The term "3rd party application" refers to an application which may be downloaded and installed to the apparatus 200 from an on-line market as generally known in the art, and various applications are used as the 3rd party application.

Such a 3rd party application is freely installed and removed. If the apparatus 200 is turned-on, a booting program is firstly loaded in a main memory unit (e.g., RAM). The booting program loads the OS to the main memory unit so that the apparatus 200 may operate. Further, the OS executes various programs by loading into the main memory unit. Particularly, when the head phone 300 is connected, the OS executes an output control program of an audio signal by loading into a main memory unit. Such a booting and a loading process are well known in the art, and thus a detailed description thereof is omitted.

The audio processor 230 encodes and decodes an audio signal. The audio processor 230 receives an audio signal from the controller 290, converts the received audio signal into an analog signal, amplifies the analog signal, and outputs the amplified analog signal to the speaker SPK. The audio processor 230 also receives an audio signal from the microphone MIC, converts the received audio signal into a digital audio signal, and provides the digital audio signal to the controller 290. The speaker SPK converts an audio signal received from the audio processor 230 into a sound to output. The microphone MIC converts a sound provided from a person or other sound sources into an audio signal.

The audio processor 230 may transmit an audio signal (analog signal) to the head phone 300 through the interface unit 250, and may receive an audio signal from the microphone 310 of the head phone 300 through the interface unit 250 under control of the controller 290. The amplifier 240 amplifies the audio signal under control of the controller 290. Specifically, the amplifier 240 is interposed between the audio processor 230 and the interface unit 250, and outputs the audio signal received from the audio processor 230 to the interface unit 250 proportional to a gain set by the controller 290. The interface unit 250 performs data communication with an external device, such as the head phone 300 in a wired or wireless communication scheme. The interface unit 250 may include an ear jack, which transmits an audio signal received from the audio processor 230 to the head phone 300, and transmits an audio signal received from the microphone 310 included in the head phone 300 to the audio processor 230. The ear jack may be equipped with an interrupt terminal, which is connected to a bias supply through a pull-up resistor.

If an ear plug of a 4-pole earphone is inserted into an ear jack, the interrupt terminal is connected to a microphone terminal of the ear plug. If the ear plug of a 3-pole ear phone is inserted into the ear jack, the interrupt terminal is connected to a ground terminal of the ear plug. As generally known in the art, a head phone (ear phone) having a microphone refers to a 4-pole (ground GND, right sound R, left sound L, microphone M) ear phone. Other types of head phones refer to a 3-pole ear phone. Meanwhile, the interface unit 250 may include a wireless communication module (e.g., Bluetooth module) to transmit and receive an audio signal to and from the head phone.

The interrupt generator 260 is connected to the interrupt terminal, generates an interrupt signal in response to variation in an output voltage of the interrupt terminal, and transmits the generated interrupt signal to the controller 290. In particular, the interrupt generator 260 may compare an output voltage of an interrupt terminal of the ear jack with a preset reference voltage V_ref to output a low level signal or a high level signal. For example, when the interrupt generator 260 is not connected to terminals (i.e., G, M, R, or L) of the ear phone, the interrupt generator 260 outputs a low level signal. If the interrupt generator 260 is connected to the terminals of the ear phone, the interrupt generator 260 outputs a high level signal.

In another embodiment, when the interrupt generator 260 is not connected to the terminals of the ear phone, the interrupt generator 260 outputs a high level signal. When the interrupt generator 260 is connected to the terminals of the ear phone, the interrupt generator 260 outputs a low level signal. An output signal of the interrupt generator 260 is transferred to the controller 290. Accordingly, when a level of a signal input from the interrupt generator 260 is changed from low to high or from high to low, the controller 290 determines that an interrupt (variation in a connection state of the ear phone or variation in an operation state of an ear phone key) is occurred.

The A/D converter 270 converts an analog voltage value into a digital voltage value. An input terminal of the A/D converter 270 is connected to an interrupt terminal and a bias power. An output terminal of the A/D converter 270 is connected to the controller 290. That is, the A/D converter 270 converts an analog voltage value input to an input terminal into a digital voltage value, and transmits the digital voltage value to the controller 290 through an output terminal. The controller 290 compares a voltage value received from the A/D converter 270 with a stored recognition table to recognize a connection state of the ear phone and an operation state of an ear phone key. The memory 220 stores the foregoing recognition table.

For example, if an input voltage is 3.3V (bias voltage), the controller 290 determines "earphone separation". If an input voltage is 3.0V, the controller 290 determines that a 4-pole ear phone is mounted. If an input voltage is 1.98 V, the controller 290 determines that a volume up key included in the head phone 300 is pushed. If an input voltage is 1.80 V, the controller 290 determines that a volume down key is pushed. If an input voltage is 0.6 V, the controller 290 determines that a call key included in the head phone 300 is pushed. If an input voltage is 0.0 V, the controller 290 determines that a 3-pole ear phone is mounted. These values are stored in the recognition table.

The impedance detector 280 detects impedance of the head phone 300 under control of the controller 290 and outputs the detected impedance to the controller 290. In addition, the impedance detector 280 may detect impedance of the head phone 300 by frequency bands (e.g., 10~10 KHz) of a sound output from the head phone 300. The controller 290 controls an overall operation of the apparatus 200 and signal flow between internal blocks of the apparatus 200, and executes a function processing data. In addition, the controller 290 includes a main memory unit to store an application program and an OS, a cache memory to temporarily store data to be written in the memory 220 and to temporarily store data read from the memory 220, a CPU (Central Processing Unit), and a GPU (graphic processing unit). The OS serves as an interface between hardware and a program, and manages computer resources such as the CPU, the GPU, the main memory unit, and the secondary memory unit.

That is, the OS operates the apparatus 200, determines an order of a task, and controls operations of the CPU and the GPU. Further, the OS performs a function of controlling execution of a program (e.g., control program of an audio output), and a function of managing storage of data and files. As generally known in the art, the CPU is a core control unit of a computer system performing computation and comparison of data, and interpretation and execution of a command. The GPU is a graphic control unit performing computation and comparison of data associated with graphics, and interpretation and execution of a command.

Each of the CPU and the GPU may be integrated with one package where at least two independent cores (e.g., quad-core) are configured of a single integrated circuit. The CPU and the GPU may be implemented as a System on Chip (SoC). The CPU and the GPU may be a package of a multi-layer structure. A configuration including the CPU and the GPU is also known as an Application Processor (AP). Particularly, when the head phone 300 is connected to the interface unit 250, the controller 290 executes a control program of an audio output to control an output of audio. A detailed embodiment associated with a function of the controller 290 is described below.

Since the structural elements can be variously changed due to convergence trends of digital devices, the many variations of the configuration cannot all be listed. The apparatus 200 according to the present invention may further include elements that are not mentioned such as a GPS module, a Bluetooth module, a Near Field Communication (NFC) module, a vibration motor, a camera, an acceleration sensor, and a gyro sensor, among others.

Figure 3:
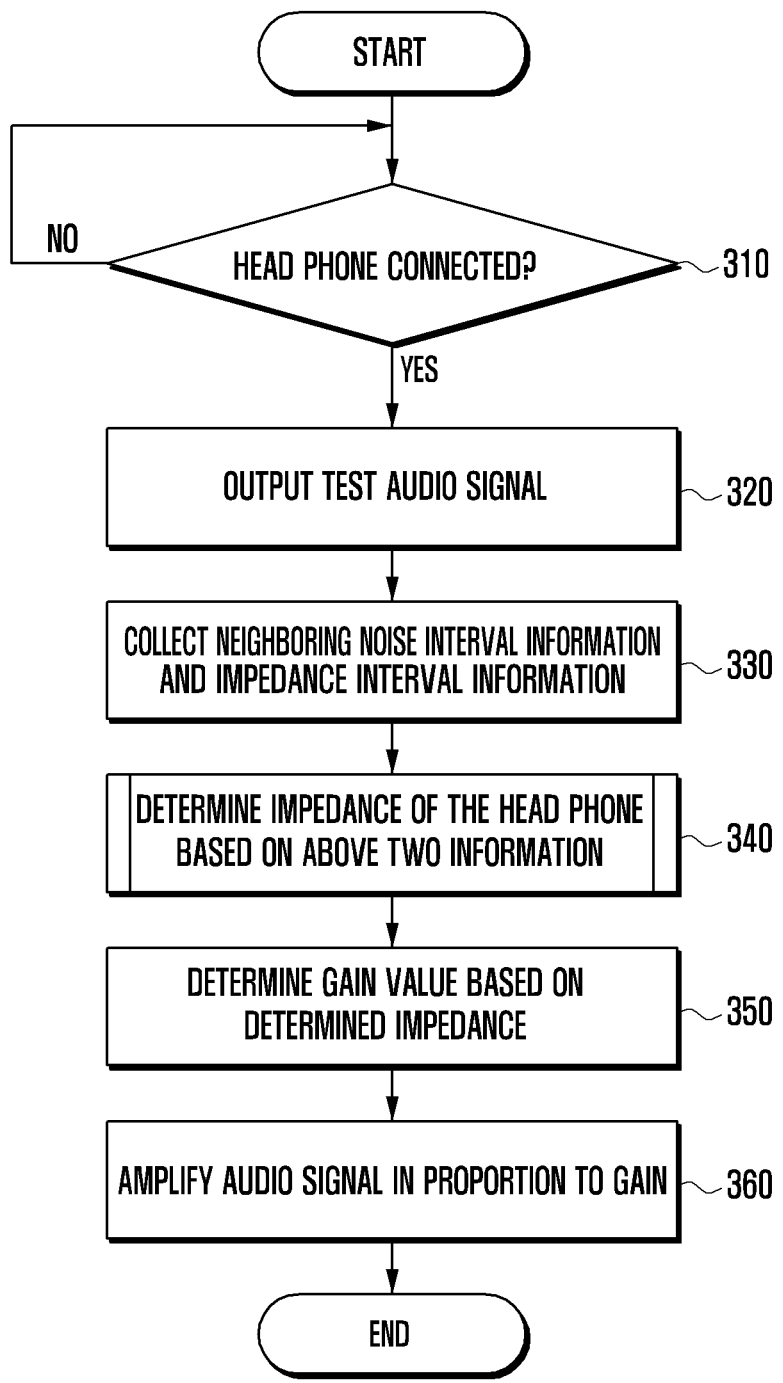
FIG. 3 is a flowchart illustrating a method of controlling an audio output according to an embodiment of the present invention.
Figure 4:
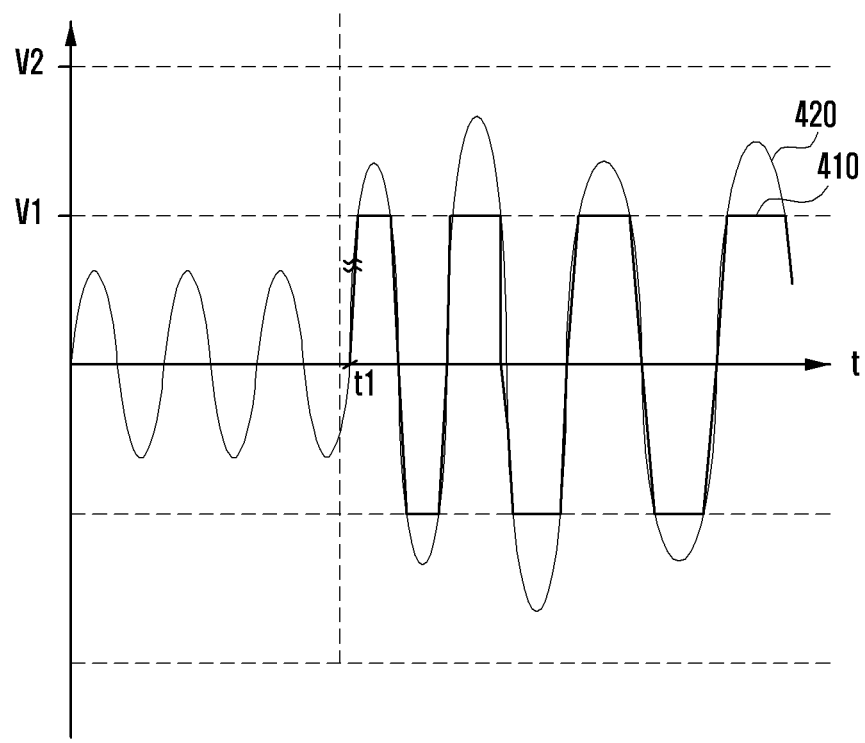
FIG. 4 is a diagram illustrating a bias voltage of the amplifier and an audio signal output from an amplifier.

FIG. 3 is a flowchart illustrating a method of controlling an audio output according to an embodiment of the present invention. FIG. 4 is a diagram illustrating a bias voltage of the amplifier 240 and an audio signal output from an amplifier. In FIG. 4, an X axis represents a time, and a Y axis represents a bias voltage.

Referring to FIG. 3, a controller 290 determines whether a head phone 300 is connected in step 310. When a level of a signal input through the interrupt generator 260 is changed from low to high, the controller 290 recognizes that the head phone 300 is connected to the interface unit 250. Further, the controller 290 may recognize a type of the head phone 300 according to a voltage value received from the A/D converter 270. For example, when the voltage is 3.0 V, the controller 290 recognizes that a microphone 310 is mounted in the head phone 300. The controller 290 controls an audio processor 230 to output a test audio signal to the head phone 300 in step 320. The test audio signal is used to measure impedance of the head phone 300. For example, a playback time of the test audio signal may be two seconds. However, the present invention is not limited thereto. In addition, a frequency band of the test audio signal may be 10~10 KHz.

The controller 290 collects neighboring noise interval information from the microphone MIC while the test audio signal is output (played) in step 330. When a microphone is included in the head phone 300 connected to the interface unit 250, the controller 290 may collect neighboring noise interval information from the microphone 310 of the head phone 300 instead of the microphone MIC. While the test audio signal is output (played), the controller 290 controls the impedance detector 280 to detect the impedance of the head phone 300, and collects impedance interval information from the impedance detector 280 in step 330.

The controller 290 determines impedance (intrinsic impedance) of the head phone 300 based on the neighboring noise interval information and the impedance interval information in step 340. For example, the controller 290 determines impedance collected at a time point when there is a minimum neighboring noise as the impedance of the head phone 300. The controller 290 determines a gain of an audio signal based on the determined impedance in step 350. For example, the controller 290 reads a gain table from the memory 220, selects a gain corresponding to the determined impedance from the read gain table, and determines the selected gain as a gain of the amplifier 240. In this case, the controller 290 may select the gain table based on a type of a recognized head phone.

For example, when the recognized head phone is a 4-pole ear phone, the controller 290 may read a gain table corresponding to the 4-pole ear phone from the memory 220. Power of the head phone 300 is proportional to a square of a voltage Vh to be supplied to the head phone 300 and inversely proportional to impedance Z. The power is proportional to magnitude of an sound output from the head phone 300. For example, when the impedance Z is 32Ω and a supply voltage Vh is 2 V, the power of the head phone is 125 mW. In this case, it is assumed that a gain is '1'. When the impedance Z is changed to 300Ω, the controller 290 increases a gain to 3.06 so that a supply voltage Vh becomes 6.12 V. Accordingly, although a head phone having impedance of 300Ω replaces a head phone having impedance of 32Ω, power (that is, magnitude of voice) is not reduced and remains as 125 mW.

Further, the controller 290 may determine a bias voltage Vb of the amplifier 240 based on the determined gain in step 350. Referring to FIG. 4, a graph having reference numeral 410 represents an audio signal output from the amplifier 240 when the bias voltage Vb is V1. A graph having reference numeral 420 represents an audio signal output from the amplifier 240 when the bias voltage Vb is V2. For example, it is assumed that a head phone having impedance of 300Ω replaces a head phone having impedance of 32Ω at the time point t1. When the bias voltage Vb remains at V1 after the time point t1, the amplifier 240 clips the audio signal as a bias voltage V1 and outputs the clipped audio signal as shown in FIG. 4. That is, when the gain of the amplifier 240 increases, the audio signal may be distorted when output. The controller 290 reads a bias voltage table from the memory 220, selects a bias voltage corresponding to the determined gain from the read bias voltage table, and determines the selected bias voltage as a bias voltage of the amplifier 240. For example, when the gain is increased from 1 to 3.06, the controller 290 increases the bias voltage Vb from V1 to V2 so that the audio signal is not clipped. The controller 290 controls the amplifier 240 to amplify an audio signal in proportion to the determined gain and to output the amplified audio signal to the head phone 300. The controller 290 controls a power manager (not shown) to supply the determined bias voltage to the amplifier 240 in step 360.

Figure 5:
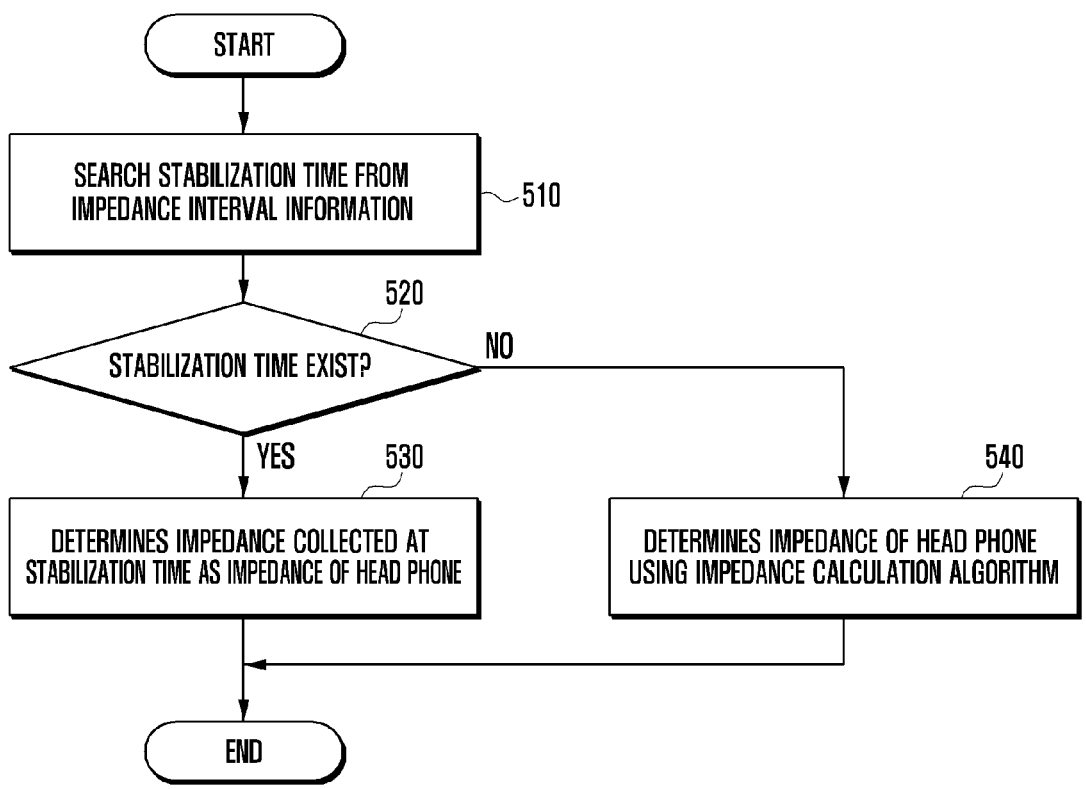
FIG. 5 is a flowchart illustrating step 340 shown in FIG. 3 in detail.
Figure 6:
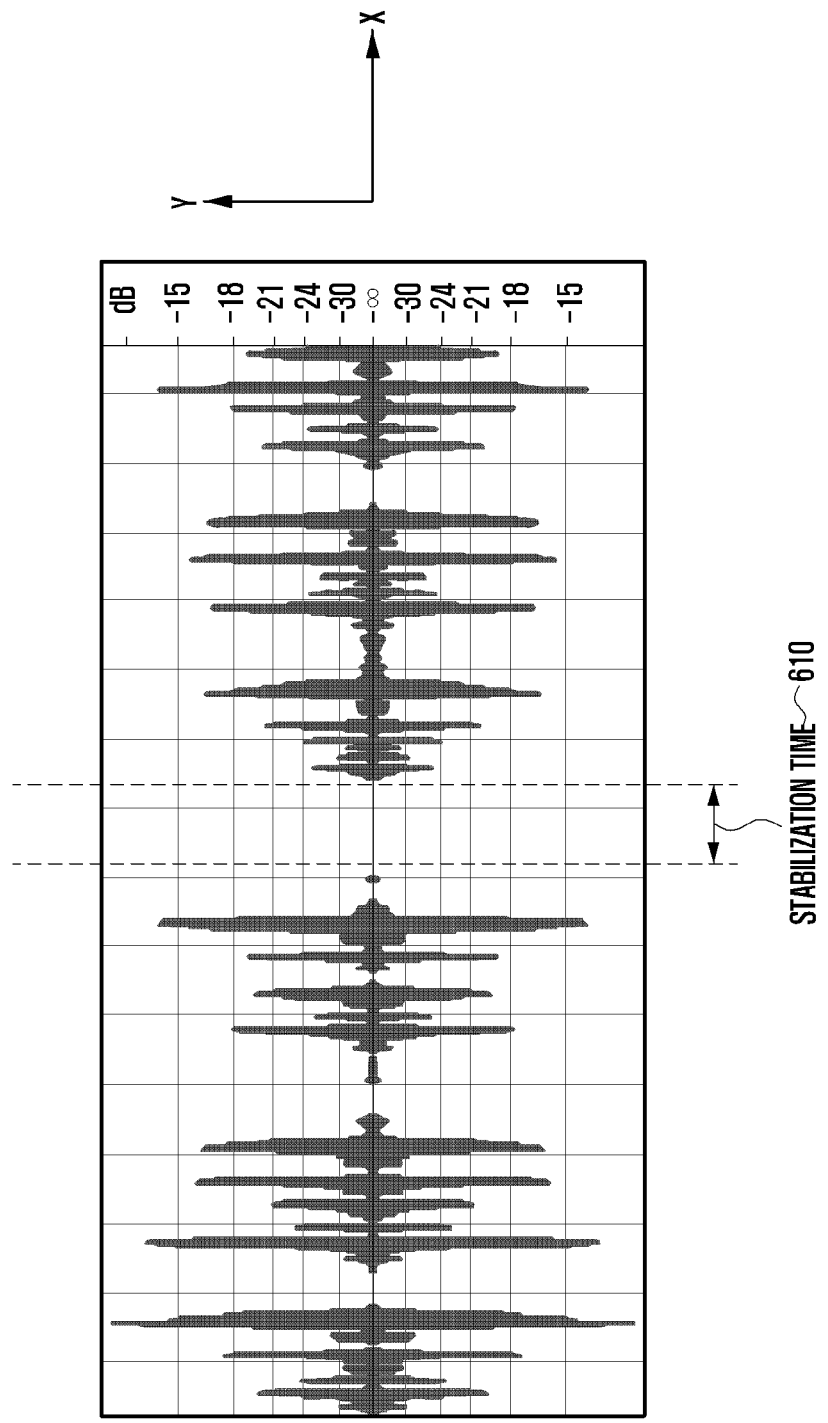
FIG. 6 is a graph illustrating neighboring noise interval information.
Figure 7:
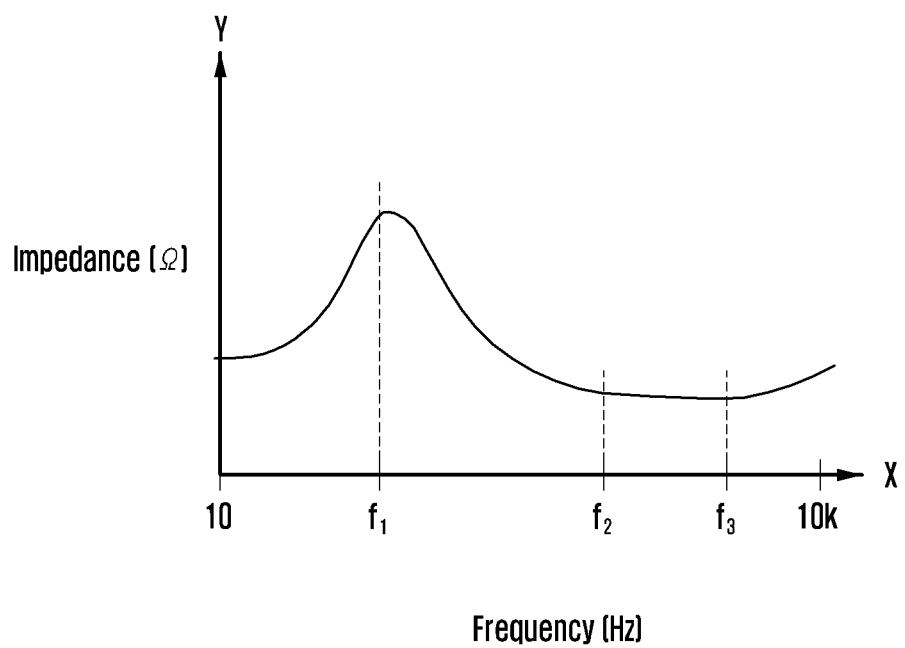
FIG. 7 is a graph illustrating a frequency characteristic of impedance.

FIG. 5 is a flowchart illustrating step 340 shown in FIG. 3 in detail. FIG. 6 is a diagram illustrating neighboring noise interval information. In FIG. 6, an X axis represents a time, and a Y axis represents magnitude (dB) of a neighboring noise. FIG. 7 is a diagram illustrating a frequency characteristic of impedance. In FIG. 7, an X axis represents a frequency, and a Y axis represents impedance.

Referring to FIGS. 5 to 7, the controller 290 searches a stabilization time (e.g., 0.1 second; see reference numeral 610 of FIG. 6) where magnitude of a neighboring noise is lower than a preset threshold value from the neighboring noise interval information (see FIG. 6) in step 510. The controller 290 determines whether the stabilization time exists in step 520. When the stabilization time exists, the controller 290 determines impedance collected at the stabilization time in the impedance interval information as impedance of the head phone 300 in step 530. When the stabilization time does not exist, that is, when the magnitude of a neighboring noise collected during playback of the test audio signal is greater than the threshold value, the controller 290 determines impedance of a head phone 300 using an impedance calculation algorithm in step 540. Referring to FIG. 7, the impedance of the head phone 300 has different values by frequency bands. The controller 290 may determine impedance at a low frequency, for example, at 10 Hz, as the impedance of the head phone 300. As a frequency increases, the impedance of the head phone 300 increases and is reduced at a specific frequency f1, and is converged to a specific impedance at a specific frequency interval f2~f3. An average of the impedances in the convergence frequency interval may be determined as the impedance of the head phone 300.

As mentioned above, the method and the apparatus for controlling an audio output according to the present invention provides a stable sound to a user by controlling an amplification gain of an audio signal based on neighboring noise.

Although certain embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

What is claimed is:

1. A method of controlling an audio output in a portable terminal, the method comprising:
    collecting impedance information of a head phone when the head phone is connected to the portable terminal;
    collecting audio noise information around the portable terminal while collecting the impedance information of the head phone;
    determining a gain of an audio signal to be output through the head phone based on impedance of the head phone determined based on both of the collected impedance information and the audio noise information; and
    amplifying the audio signal according to the determined gain, and outputting the amplified audio signal to the head phone.

2. The method of claim 1, wherein the audio noise information is a magnitude of a neighboring noise during time periods collected for a preset playback time, and the impedance information is an impedance level of the head phone during time periods collected for the preset playback time.

3. The method of claim 1, further comprising determining a bias voltage of an amplifier based on the determined gain.

4. The method of claim 1, wherein collecting the audio noise information comprises collecting the audio noise information from a microphone of the head phone, when the head phone is connected to the portable terminal that includes the microphone.

5. A portable terminal comprising:
    a microphone;
    an interface unit for connecting to a head phone;
    an audio processor outputting an audio signal to the head phone through the interface unit;
    an amplifier interposed between the audio processor and the interface unit configured to amplify an audio signal received from the audio processor and output the amplified audio signal to the head phone;
    an impedance detector configured to collect impedance of the head phone; and
    a controller configured to:
    control the impedance detector to collect impedance information of the head phone when the head phone is connected to the portable terminal;
    collect audio noise information around the portable terminal while collecting the impedance information of the head phone;
    determine a gain of an audio signal to be output through the head phone based on impedance of the head phone determined based on both of the collected impedance information and the audio noise information; and
    control the amplifier to amplify the audio signal according to the determined gain, and output the amplified audio signal to the head phone.

6. The portable terminal of claim 5, wherein the audio noise information is a magnitude of a neighboring noise during time periods collected for a preset playback time, and the impedance information is the impedance of the head phone during time periods collected for the preset playback time.

7. The portable terminal of claim 6, wherein the controller is configured to search a stabilization time where the magnitude of the neighboring noise is lower than a preset threshold value from the audio noise, and to determine impedance collected at the stabilization time in the impedance information as the impedance of the head phone when the stabilization time exists as a result of the search.

8. The portable terminal of claim 7, wherein the controller is configured to determine impedance corresponding to a lowermost frequency in the impedance information or an average of impedance corresponding to a convergence frequency interval as the impedance of the head phone when the stabilization time does not exist.

9. The portable terminal of claim 5, wherein the controller is configured to determine a bias voltage of the amplifier based on the determined gain.

10. The portable terminal of claim 5, wherein the controller is configured to collect the audio noise information from the microphone of the headphone when the head phone includes the microphone.

* * * * *